(12) United States Patent
Jian

(10) Patent No.: US 8,302,874 B2
(45) Date of Patent: Nov. 6, 2012

(54) WASTE HEAT REUSING SYSTEM

(75) Inventor: Zh-Wei Jian, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 724 days.

(21) Appl. No.: 12/553,936

(22) Filed: Sep. 3, 2009

(65) Prior Publication Data

US 2011/0042059 A1    Feb. 24, 2011

(30) Foreign Application Priority Data

Aug. 20, 2009  (CN) .......................... 2009 1 0305858

(51) Int. Cl.
*G05D 23/13* (2006.01)
(52) U.S. Cl. ........................ 236/12.1; 236/12.15; 236/13
(58) Field of Classification Search ................. 236/12.1, 236/12.11, 12.15, 12.23, 13; 165/287, 299, 165/300

See application file for complete search history.

(56) References Cited

U.S. PATENT DOCUMENTS

| | | | | |
|---|---|---|---|---|
| 4,240,499 A | * | 12/1980 | Kals | 165/292 |
| 4,503,902 A | * | 3/1985 | Zolik | 165/47 |
| 4,516,628 A | * | 5/1985 | Ward | 165/294 |
| 6,779,735 B1 | * | 8/2004 | Onstott | 236/13 |
| 2008/0289811 A1 | * | 11/2008 | Kariya | 165/300 |

* cited by examiner

*Primary Examiner* — Marc Norman
(74) *Attorney, Agent, or Firm* — Altis Law Group, Inc.

(57) ABSTRACT

When the detected temperature by the first temperature sensor is greater than the preset temperature value, the controller controls the airflow capacity of the waste heat inputted into the first intake apparatus to be reduced and controls the airflow capacity of the cold air inputted into the second intake apparatus to increase, therefore, the temperature of the waste heat inputted into the first intake apparatus is reduced. When the detected temperature by the first temperature sensor is less than the preset temperature value, the controller controls the heater to heat the waste heat inputted into the first intake apparatus, when the detected temperature by the first temperature sensor reaches the preset temperature value, the controller controls the first valve to open, to output the waste heat.

7 Claims, 2 Drawing Sheets

WASTE HEAT REUSING SYSTEM

BACKGROUND

1. Technical Field

The present disclosure relates to a waste heat reusing system.

2. Description of Related Art

Nowadays, some computers or servers with high working frequencies operate at faster and faster speeds. Therefore, more heat is produced. Though air conditioners or other heat dissipating devices are ordinarily used to dissipate the heat generated by the computers or servers, they normally lack heat reusing mechanisms.

DETAILED DESCRIPTION

Figure 1:
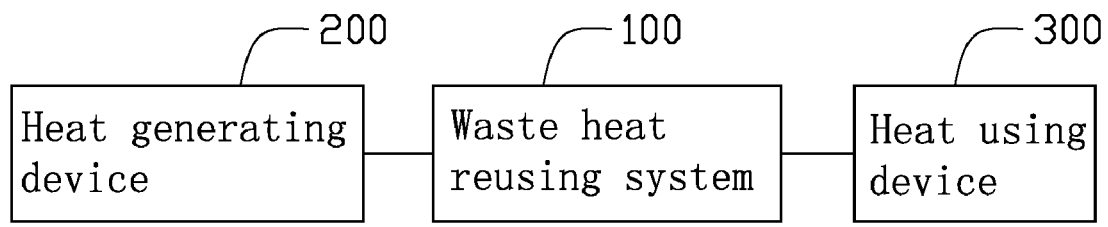
FIG. 1 is a schematic diagram of an embodiment of a waste heat reusing system connected to a heat generating device and a heat using device.
Figure 2:
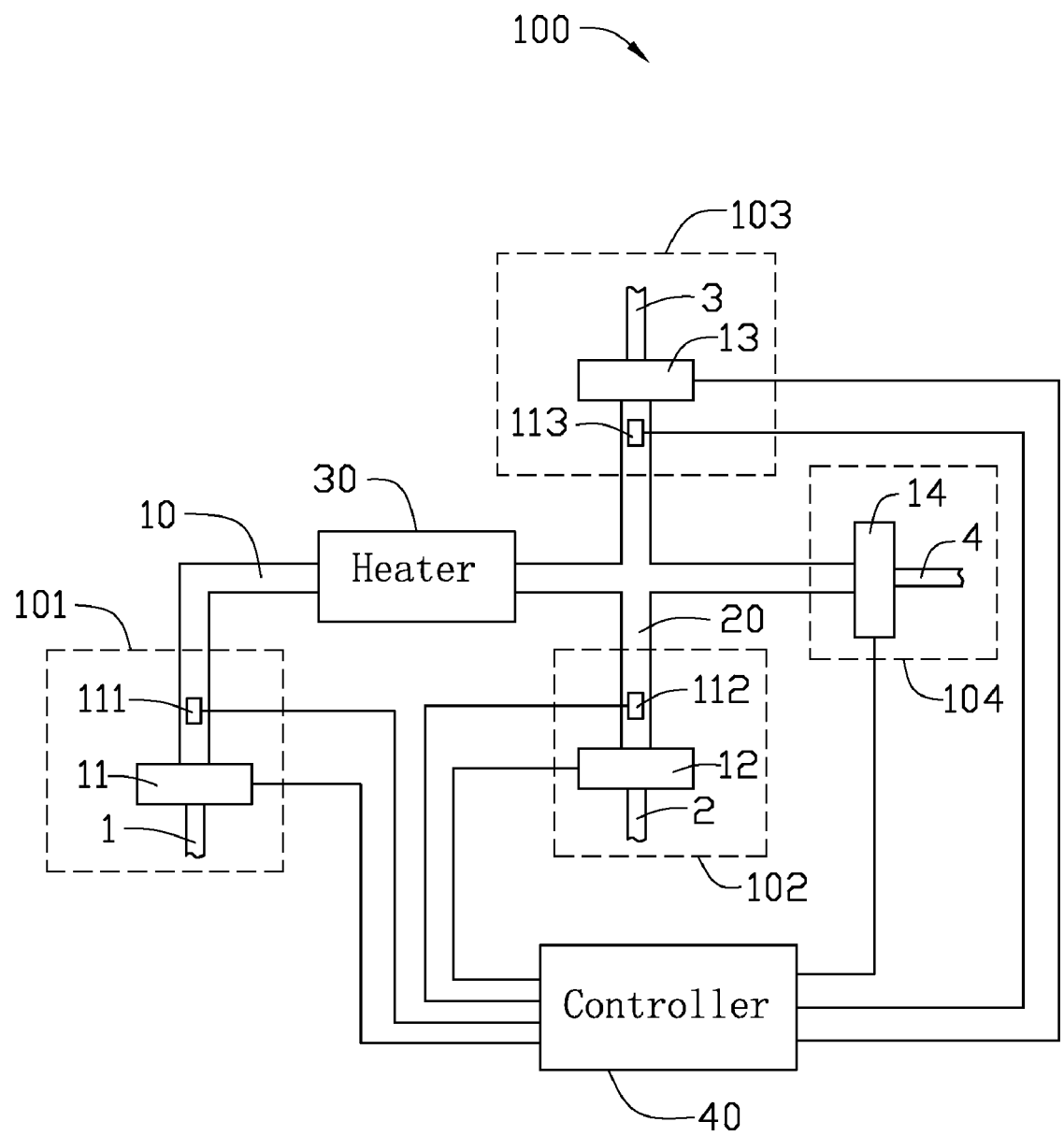
FIG. 2 is a block diagram of an embodiment of the waste heat reusing system of FIG. 1.

Referring to FIGS. 1 and 2, a waste heat reusing system 100 is provided to process waste heat generated by a heat generating device 200, such as a data center, and send the waste heat to a heat using device 300, such as a drying device. For example, servers of the data center will vent a mass of waste heat when the servers are running. The waste heat needs to be processed (such as heated or reduced a temperature) via the waste heat reusing system 100 before the waste heat is provided to the heat using devices 300.

An exemplary embodiment of the waste heat reusing system 100 includes a first intake apparatus 101, a second intake apparatus 102, a first outlet apparatus 103, a second outlet apparatus 104, a heater 30, and a controller 40. The first intake apparatus 101 receives the waste heat from the heat generating device 200. The second intake apparatus 102 receives cold air from environment. The heater 30 heats the waste heat received by the first intake apparatus 101, to increase a temperature of the received waste heat. The first outlet apparatus 103 outputs the waste heat processed by the waste heat reusing system 100 to the heat using device 300. The second outlet apparatus 104 vents waste heat in the first intake apparatus 101 and the cold air in the second intake apparatus 102 which exceed what that is needed before the first outlet apparatus 103 is turned on. The controller 104 controls the airflow capacities of the first and second intake apparatuses 101 and 102 to reduce the temperature of the waste heat received by the first intake apparatus 101, or controls the heater 30 to heat the waste heat received by the first intake apparatus 101 to increase the temperature of the received waste heat and controls the first outlet apparatus 103 to output the waste heat processed by the waste heat reusing system 100 to the heat using devices 300.

The first intake apparatus 101 includes an intake 1, a valve 11, a temperature sensor 111, and a pipe 10. The second intake apparatus 102 includes an intake 2, a valve 12, a temperature sensor 112, and a pipe 20. The first outlet apparatus 103 includes an outlet 3, a valve 13, and a temperature sensor 113. The second outlet 104 includes an outlet 4 and a valve 14.

The intake 1 is connected to the pipe 10 via the valve 11, to receive the waste heat generated by the heat generating device 200 and sends the waste heat to the pipe 10. The valve 11 regulates the airflow capacity of the waste heat inputted into the pipe 10. The temperature sensor 111 detects the temperature of the waste heat inputted into the pipe 10 and sends the temperature data to the controller 40. The intake 2 is connected to the pipe 20 via the valve 12, to receive cold air from environment and sends the cold air to the pipe 20. The valve 12 regulates the airflow capacity of the cold air inputted into the pipe 20. The temperature sensor 112 detects the temperature of the cold air and sends the temperature data to the controller 40. The temperature sensor 113 detects the temperature of the waste heat outputted by the waste heat reusing system 100 and sends the temperature data to the controller 40. The valve 13 regulates the airflow capacity of the waste heat outputted through the outlet 3. The valve 14 regulates the airflow capacity of the vented exceed anticipation waste heat. In one embodiment, the valves 11-13 are electromagnetic valves.

The temperature sensor 111 is located in the pipe 10 and adjacent to the valve 11. The temperature sensor 112 is located in the pipe 20 and adjacent to the valve 12. The pipe 10 is connected to the pipe 20 via the heater 30, and then connected to the outlet 3 via the valve 13 and the outlet 4 via the valve 14. The temperature sensor 113 is located in the pipe 20 and adjacent to the valve 13. The valves 11-14 and the temperature sensors 111-113 are connected to the controller 40.

In use, the controller 40 stores a preset temperature value according to a requirement of the heat using device 300. The valve 11 is turned on, the waste heat generated by the heat generating device 200 enters the pipe 10 of the waste heat reusing system 100. The temperature sensor 111 detects the temperature of the waste heat and sends the detected temperature data to the controller 40. The controller 40 compares the detected temperature by the temperature sensor 111 with the preset temperature value, if the detected temperature is greater than the preset temperature value, the controller 40 controls the valve 12 to open, the cold air is inputted into the pipe 20 via the intake 2 and the valve 12, and the controller 40 controls the valve 14 to open, the excessive waste heat may be vented through the outlet 4. Due to the pipe 10 and 20 being connected together, the cold air of the pipe 20 is mixed with the waste heat of the pipe 10, to reduce the temperature of the waste heat of the waste heat reusing system 100.

The temperature sensor 113 detects the temperature of the waste heat through the outlet 3 and sends the temperature data to the controller 40. The controller 40 compares the detected temperature by the temperature sensor 113 with the preset temperature value, if the detected temperature has not decreased to the preset temperature value, the controller 40 reduces an opening degree of the valve 11 for reducing the airflow capacity of the waste heat inputted into the pipe 10, or increases the opening degree of the valve 12 for improving the airflow capacity of the cold air inputted in the pipe 20. Due to the pipes 10 and 20 being connected together, the temperature of the waste heat inputted into the pipe 10 can be reduced, to reach the preset temperature value. If the detected temperature of the temperature sensor 113 reaches the preset temperature value, the controller 40 controls the valve 14 to close, and controls the valve 13 to open, to output the waste heat processed by the waste heat reusing system 100 to the heat using device 300.

If the detected temperature by the temperature sensor 111 is less than the preset temperature value, the controller 40 increases the opening degree of the valve 11 and controls the heater 30 to heat the waste heat inputted into the pipe 10, and reduces the opening degree of the valve 14. The temperature sensor 113 detects the temperature of the waste heat through the outlet 3 and sends the temperature data to the controller

40. The controller 40 compares the detected temperature by the temperature sensor 113 with the preset temperature value, if the detected temperature by the temperature sensor 113 does not reach the preset temperature value, the controller 40 controls the heater 30 to heat the waste heat inputted into the pipe 10 until the temperature of the waste heat inputted into the pipe 10 reaches the preset temperature value. If the detected temperature by the temperature sensor 113 reaches the preset temperature value, the controller 40 controls the valve 14 to close, and controls the valve 13 to open for outputting the wasted heat processed by the waste heat reusing system 100 to the heat using device 300.

The controller 40 controls the opening degree of the valves 11 and 12 to reduce the temperature of the waste heat inputted into the waste heat reusing system 100, or controls the heater 30 to heat the waste heat inputted into the waste heat reusing system 100 to increase the temperature of the waste heat inputted into the waste heat reusing system 100. Therefore, the waste heat outputted by the heat generating device 200 can be provided to the heat using device 300 via the waste heat reusing system 100, to reuse the waste heat effectively.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others skilled in the art to utilize the disclosure and various embodiments and with various modifications as are suited to the particular use contemplated. Alternately embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A waste heat reusing system, comprising:
   a first intake apparatus to receive waste heat from a heat generating device;
   a second intake apparatus to receive cold air from environment;
   a heater to heat the waste heat received by the first intake apparatus;
   a first outlet apparatus to output the waste heat when the temperature of the waste heat reaches a preset temperature value, the first outlet apparatus comprising:
      a first outlet;
      a first valve; and
      a first temperature sensor to detect the temperature of the waste heat of the first outlet;
   a second outlet apparatus venting the waste heat and the cold air before the first outlet apparatus is turned on; and
   a controller storing the preset temperature value, and receiving the temperature data of the waste heat detected by the first temperature sensor, wherein when the detected temperature by the first temperature sensor is greater than the preset temperature value, the controller controls the airflow capacity of the waste heat inputted into the first intake apparatus to be reduced and controls the airflow capacity of the cold air inputted into the second intake apparatus to increase, therefore, the temperature of the waste heat inputted into the first intake apparatus is reduced; wherein when the detected temperature by the first temperature sensor is less than the preset temperature value, the controller controls the heater to heat the waste heat inputted into the first intake apparatus, when the detected temperature by the first temperature sensor reaches the preset temperature value, the controller controls the first valve to open, to output the waste heat.

2. The waste heat reusing system of claim 1, wherein the first intake apparatus comprises a first pipe, a first intake to receive the waste heat outputted by the heat generating device, a second valve to regulate the airflow capacity of the waste heat inputted into the first pipe, and a second temperature sensor to detect the temperature of the waste heat inputted into the first pipe and send the temperature data to the controller.

3. The waste heat reusing system of claim 2, wherein the second intake apparatus comprises a second pipe, a second intake to receive the cold air from environment, a third valve to regulate the airflow capacity of the cold air inputted into the second pipe, and a third temperature sensor to detect the temperature of the cold air inputted into the second pipe and send the temperature data to the controller.

4. The waste heat reusing system of claim 3, wherein the second outlet apparatus comprises a second outlet and a fourth valve, the controller controls the fourth valve to open before the third valve is turned on, to vent the waste heat which does not reach the preset temperature value through the second outlet, the controller controls the fourth valve to close after the third valve is turned on, to output the waste heat which reaches the preset temperature value through the first outlet.

5. The waste heat reusing system of claim 4, wherein the first to fourth valves are electromagnetic valves.

6. The waste heat reusing system of claim 5, wherein the first intake is connected to the first pipe via the second valve, the second temperature sensor is located in the first pipe and adjacent to the second valve, the second intake is connected to the second pipe via the third valve, the third temperature sensor is located in the second pipe and adjacent to the third valve, the first pipe is connected to the second pipe via the heater, and then connected to the first outlet via the first valve and the second outlet via the fourth valve, the first temperature sensor is located in the second pipe and adjacent to the first valve, the first to fourth valves and the first to third temperature sensors are connected to the controller.

7. The waste heat reusing system of claim 1, wherein the first outlet is connected to a heat using device to use to output the waste heat.

* * * * *